United States Patent [19]
Tenbrink et al.

[11] Patent Number: 5,898,021
[45] Date of Patent: Apr. 27, 1999

[54] METHOD OF MANUFACTURING AN OXIDE CERAMIC SUPERCONDUCTOR HAVING A HIGH CORE DENSITY

[75] Inventors: Johannes Tenbrink, Moembris; Paul Puniska, Neuberg; Volker Gluecklich, Hammersbach; Klaus Heine, Obertshausen, all of Germany

[73] Assignee: Vacuumschmelze GmbH, Hanau, Germany

[21] Appl. No.: 08/020,304

[22] Filed: Feb. 19, 1993

[30] Foreign Application Priority Data

Feb. 19, 1992 [DE] Germany ............................ 42 05 008

[51] Int. Cl.$^6$ ............................ H01L 39/24; H01B 12/00
[52] U.S. Cl. ........................ 505/433; 505/431; 505/434; 505/450; 505/704; 505/739; 505/740
[58] Field of Search ................. 505/1, 704, 740, 505/733, 739, 431, 433, 434, 450; 427/62, 63; 29/599; 174/125.1

[56] References Cited

U.S. PATENT DOCUMENTS 5,043,320  8/1991  Meyer et al. ............................. 505/1
5,145,835  9/1992  Takeshita et al. ........................ 505/1
5,169,831  12/1992  Yamamoto et al. ....................... 505/1

FOREIGN PATENT DOCUMENTS 41 04 421  8/1992  Germany .
56-59530  5/1981  Japan .

OTHER PUBLICATIONS

Perng et al, "Y–Ba–Cu–O Superconducting films grown on (100) magnesia and sapphire substrates by a melt growth method without crucible", Supercond. Sci. Technol. 3 (1990) pp. 233–237.

Szulczyk et al, "Herstellung von Nb$_3$Sn–und YBa$_2$Cu$_3$O$_7$–Supraleitern in Drahtform", *Metall*, vol. 43, No. 5, 1989, p–418ff.

*Primary Examiner*—Roy V. King
*Attorney, Agent, or Firm*—Hill & Simpson

[57] ABSTRACT

A superconductive composite member, which has a core composed of an oxide ceramic material which is surrounded by an envelope, has an increased core density in order to achieve a higher critical current density. The increased core density is obtained during a hot-shaping step of the core material in the envelope, wherein the composite is heated to a temperature wherein the superconductor material is present in either a molten or a partially molten state.

4 Claims, 1 Drawing Sheet

METHOD OF MANUFACTURING AN OXIDE CERAMIC SUPERCONDUCTOR HAVING A HIGH CORE DENSITY

BACKGROUND OF THE INVENTION

The present invention is directed to a method for manufacturing a superconductive composite member by introducing an oxide ceramic superconductive material into an envelope to form an initial composite member, shaping the initial composite member by reducing its cross section to the shape of the final composite member with thermal treatment for recovery and for setting the oxygen concentration. The invention is also directed to a corresponding superconductive composite member.

Superconductive composite members wherein an oxide ceramic superconductive powder is surrounded by an envelope material are known. Examples are disclosed in an article by H. Krauth and A. Szulczyk in METALL, Vol. 43, 1989, pages 418ff. The composite members, such as wires or bands that are also superconductive above the temperature of liquid nitrogen, are manufactured by employing oxide ceramic high-temperature superconductors (HTSC). The materials suitable for this purpose are known per se. Included among them, for example, are phases in the systems of YBaCuO, BiSrCaCuO and TlBaCaCuO.

For manufacturing technical conductors, oxide ceramic powder is filled, for example, into a metal tube and a wire or band is then manufactured by shaping to reduce the cross section of the metal tube or envelope to the desire shape. Subsequently, a thermal treatment is implemented that serves the purpose of producing the continuous, superconductive connection through the HTSC material and the purpose of optimizing the critical current density.

The envelope is usually composed of silver or of silver alloys, because these materials will guarantee the oxygen permeation through the envelope material during the final thermal treatment for setting the optimum oxygen content.

In order to achieve a higher filling density in the manufacture of the composite members, the powder may be pressed into rods or pellets and then filled into the tube or a melt can be filled into the envelope tube. With reference to the theoretical density for the HTSC material, a filling density of approximately 55% is achieved by utilizing powders. Filling densities of approximately 70% are achieved by employing the powder pressed into rods or pellets and a filling density of up to 100% is obtained by filling with a melt. After the shaping of the filled tubes to form the finished composite wire by a drawing or a combination of drawing and rolling steps, the core density of the oxide ceramic superconductive material typically amounts to 65% through 75% of the theoretical density. In the final annealing for setting the superconductive properties, large pores in the core of the HTSC material will occur and will result in a greatly reduced critical current density form, due to the partial melting of the core connected therewith. These pores are, thus, undesirable and should be largely avoided.

SUMMARY OF THE INVENTION

It is, therefore, an object of the present invention to eliminate the above-described disadvantages and to provide a method for manufacturing oxide ceramic composite members having increased core density, as well as to specify a corresponding composite member having a reduced number of pores.

In the method of manufacturing a superconductive composite member, the object of the present invention is achieved in that the cross sectional-reducing shaping contains at least one hot-shaping step, wherein the superconductor material is present in a molten or partially molten condition. The superconductive composite member of the invention comprises a core density of more than 80% of the theoretical density.

An increase in the core density is thus achieved with the method of the present invention in that the hot-shaping step is provided, and the superconductor material is present in at least a partially molten condition or a molten condition and is, thus, plastically shapable. This hot-shaping step can, in particular, be a matter of hot-drawing or hot-rolling. While copending U.S. application Ser. No. 07/833,466, filed Feb. 6, 1992, now abandoned, whose disclosure is incorporated herein by reference thereto, and which claims priority from German Application P 41 04 421.5, already discloses a method for manufacturing a superconductive composite member using a hot-rolling procedure, the temperature used during hot-rolling, however, is still below the melting temperature of the superconductive material so that the partial melting thereof does not yet occur. A BiSrCaCuO superconductor material is specifically recited therein having a melting temperature of 890° C. Given this superconductor material, the copending application discloses that the temperature during hot-rolling should be in a range of between 500° C. and 800° C. and, thus, this temperature still lies clearly below the melting temperature.

Other advantages and features of the invention will be readily apparent from the following description of the preferred embodiments, the drawing and claims.

DESCRIPTION OF THE PREFERRED EMBODIMENTS

Figure 1:
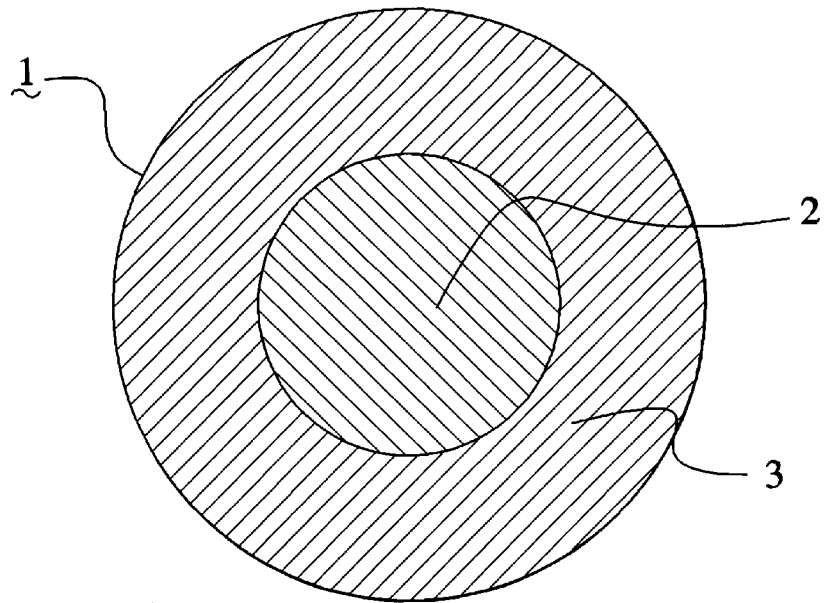
FIG. 1 is a transverse cross sectional view of a composite member in accordance with the present invention.

The principles of the present invention are particularly useful when incorporated in a superconductive composite member 1, which has a core 2 of an oxide ceramic superconductor material and an envelope 3 that is preferably composed of either silver or a silver alloy.

In a specific exemplary embodiment, a one-core conductor having a core composed of BiSrCaCuO superconductor compound (2212-phase) and a silver envelope 3 is manufactured. The cross sectional-reducing shaping occurs by drawing. The composite member 1 was coated with a graphite suspension for lubrication before the drawing and was pre-heated to a temperature above the melting temperature of the oxide ceramic material. The temperature of the last heating stage, therefore, will amount to approximately 930° C. The drawing die was also heated, namely to a temperature of more than 500° C. With the drawing rate of 3 m through 4 m per minute, the composite member was brought from a diameter of 1.46 mm to a diameter of 1.39 mm in one draw by hot-drawing. The core density thereby increases from 68% of the theoretical density to 83% after this hot-drawing. A second draw to a diameter of 1.31 mm produced another slight increase of the core density to 84%.

Analogous to the described hot-drawing, the cross sectional-reducing shaping can also be implemented by the inventive hot-rolling with heated rollers. The preferred temperature of the rollers, as well as the drawing dies when drawing, thereby lie between 400° C. and 700° C.

In comparative tests, various methods were implemented for cross sectional reduction and their suitability for increasing the core density was investigated. What was thereby involved was rolling after pre-heating, but at a temperature below the melting point of the oxide ceramic material. In addition, a uniaxial pressing as well as uniaxial hot-pressing at 630° C. and hot-isostatic pressing at 750° C. were tried. An increase in the core density was not achieved in any case with these comparative tests.

Figure 2:
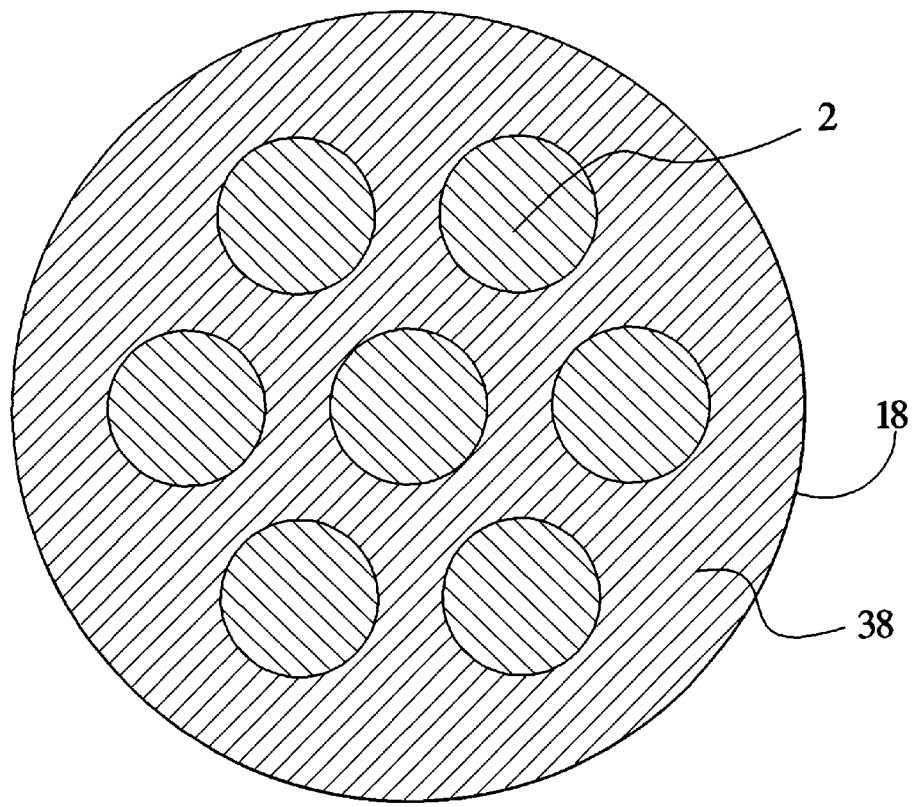
FIG. 2 in a transverse cross sectional view of a multi-core composite member.

Whereas the manufacture of a one-core conductor was described in the exemplary embodiment, of FIG. 1, a composite member 1a (FIG. 2) with multi-core conductors 2 can also be manufactured with the method of the present invention. For example, a multi-core composite member 1a can have seven cores 2 with an outer envelope 3a that surrounds the individual cores 2 band also separates the cores 2 from each other.

Although various minor modifications may be suggested by those versed in the art, it should be understood that we wish to embody within the scope of the patent granted hereon all such modifications as reasonably and properly come within the scope of our contribution to the art.

We claim:

1. In a method for manufacturing a superconductive composite member by introducing an oxide ceramic superconductor material into an envelope to form an intermediate composite, shaping the intermediate composite into a final composite by a cross section-reducing, and thermal heat-treating the final composite for recovering and for setting the oxygen concentration, the improvements comprising coating the intermediate composite before shaping with a graphite suspension, and the shaping steps including heating the intermediate composite to a temperature at which the superconductor material is present in at least a partially molten state, and subjecting the intermediate composite at said temperature to at least one hot-shaping step by drawing the intermediate composite in a drawing die.

2. In a method according to claim 1, wherein the drawing die is heated to a range of 400° C. to 700° C.

3. In a method according to claim 1, wherein the superconductor material is selected from the group consisting of BiSrCaCuO and BiPbSrCaCuO.

4. In a method according to claim 1, wherein the step of introducing the superconductor material into the envelope includes introducing the superconductor material into an envelope having multiple axially extending cores to produce a composite with a multi-core conductor.

* * * * *